(12) United States Patent
Park et al.

(10) Patent No.: US 11,597,193 B2
(45) Date of Patent: Mar. 7, 2023

(54) LAMINATE FOR MANUFACTURING FLEXIBLE DISPLAY, AND FLEXIBLE DISPLAY MANUFACTURING METHOD USING SAME

(71) Applicant: LG CHEM, LTD., Seoul (KR)

(72) Inventors: Jinyoung Park, Daejeon (KR); Jinho Lee, Daejeon (KR); Chae Won Park, Daejeon (KR)

(73) Assignee: LG CHEM, LTD., Seoul (KR)

( * ) Notice: Subject to any disclaimer, the term of this patent is extended or adjusted under 35 U.S.C. 154(b) by 330 days.

(21) Appl. No.: 16/958,295

(22) PCT Filed: Sep. 11, 2019

(86) PCT No.: PCT/KR2019/011859
§ 371 (c)(1),
(2) Date: Jun. 26, 2020

(87) PCT Pub. No.: WO2020/055182
PCT Pub. Date: Mar. 19, 2020

(65) Prior Publication Data
US 2021/0053328 A1    Feb. 25, 2021

(30) Foreign Application Priority Data
Sep. 11, 2018    (KR) .................. 10-2018-0108219

(51) Int. Cl.
*B32B 27/28*    (2006.01)
*B32B 3/30*    (2006.01)
(Continued)

(52) U.S. Cl.
CPC .............. *B32B 27/281* (2013.01); *B32B 3/30* (2013.01); *B32B 7/06* (2013.01); *B32B 17/10* (2013.01);
(Continued)

(58) Field of Classification Search
CPC ........... B32B 27/281; B32B 3/30; B32B 7/06; B32B 17/10; B32B 17/101;
(Continued)

(56) References Cited

U.S. PATENT DOCUMENTS 10,882,957 B2    1/2021  Jeong et al.
2012/0085570 A1    4/2012  Kim et al.
(Continued)

FOREIGN PATENT DOCUMENTS

CN    102459466 A    5/2012
CN    104379339 A    2/2015
(Continued)

OTHER PUBLICATIONS

International Search Report issued in PCT Application No. PCT/KR2019/011859 dated Jan. 2, 2020, 4 pages.
(Continued)

*Primary Examiner* — Michael M. Bernshteyn
(74) *Attorney, Agent, or Firm* — Rothwell, Figg, Ernst & Manbeck, P.C.

(57) ABSTRACT

The present invention employs a polyimide film, which has a coefficient of thermal expansion (CTE) that is a negative number at a temperature equal to or greater than 350° C., as a debonding layer for separating a flexible substrate and a carrier substrate, and thus can easily separate a flexible substrate from a carrier substrate by using a detaching phenomenon caused by a difference in residual stress between the flexible substrate and the debonding layer after a high-temperature process for producing an element on the flexible substrate. Therefore, the present invention can separate the flexible substrate without causing chemical or physical damage to the element formed on the flexible substrate, thereby minimizing problems that may occur during a stripping process.

12 Claims, 3 Drawing Sheets

(51) Int. Cl.
  *B32B 7/06* (2019.01)
  *B32B 17/10* (2006.01)
  *B32B 38/10* (2006.01)
  *C08G 73/10* (2006.01)
  *H01L 27/12* (2006.01)
  *H01L 27/32* (2006.01)

(52) U.S. Cl.
  CPC ...... *B32B 17/101* (2013.01); *B32B 17/10568* (2013.01); *B32B 17/10697* (2013.01); *B32B 38/10* (2013.01); *C08G 73/1007* (2013.01); *C08G 73/1067* (2013.01); *H01L 27/1262* (2013.01); *H01L 27/3262* (2013.01); *B32B 2305/72* (2013.01); *B32B 2307/30* (2013.01); *B32B 2307/546* (2013.01); *B32B 2457/20* (2013.01)

(58) Field of Classification Search
  CPC ........ B32B 17/10568; B32B 17/10697; B32B 38/10; C08G 73/1007; C08G 73/1067; H01L 27/1262; H01L 27/3262
  USPC .......................................................... 428/435
  See application file for complete search history.

(56) References Cited

U.S. PATENT DOCUMENTS

| | | | |
|---|---|---|---|
| 2015/0210048 A1* | 7/2015 | Jeong | C03C 17/3405 428/212 |
| 2015/0303408 A1 | 10/2015 | Lee et al. | |
| 2018/0007799 A1 | 1/2018 | Jeong et al. | |
| 2018/0334541 A1 | 11/2018 | Jeong et al. | |
| 2019/0048141 A1 | 2/2019 | Yun et al. | |
| 2019/0048143 A1 | 2/2019 | Hong et al. | |

FOREIGN PATENT DOCUMENTS

| | | | |
|---|---|---|---|
| CN | 104854722 A | | 8/2015 |
| CN | 107206771 A | | 9/2017 |
| CN | 107263984 A | | 10/2017 |
| EP | 3307033 A | | 4/2018 |
| JP | 2011-012255 A | | 1/2011 |
| JP | 2015-530283 A | | 10/2015 |
| JP | 2018-099800 A | | 6/2018 |
| JP | 2018099800 A | * | 6/2018 |
| KR | 10-1259544 B | | 4/2013 |
| KR | 10-2014-0122205 A | | 10/2014 |
| KR | 10-2014-0122206 A | | 10/2014 |
| KR | 10-2014-0122676 A | | 10/2014 |
| KR | 10-2015-0037401 A | | 4/2015 |
| KR | 10-2016-0094551 A | | 8/2016 |
| KR | 10-2016-0144313 A | | 12/2016 |
| KR | 10-2017-0113434 A | | 10/2017 |
| KR | 10-2017-0115339 A | | 10/2017 |
| KR | 10-1796875 B1 | | 11/2017 |
| KR | 10-2018-0032787 A | | 4/2018 |
| KR | 10-2018-0033739 A | | 4/2018 |
| WO | 2017/176000 A1 | | 10/2017 |

OTHER PUBLICATIONS

Office Action issued for Japanese Patent Application No. 2020-529564 dated Jun. 29, 2021, with English translation, 7 pages.

* cited by examiner

[Fig. 1a]
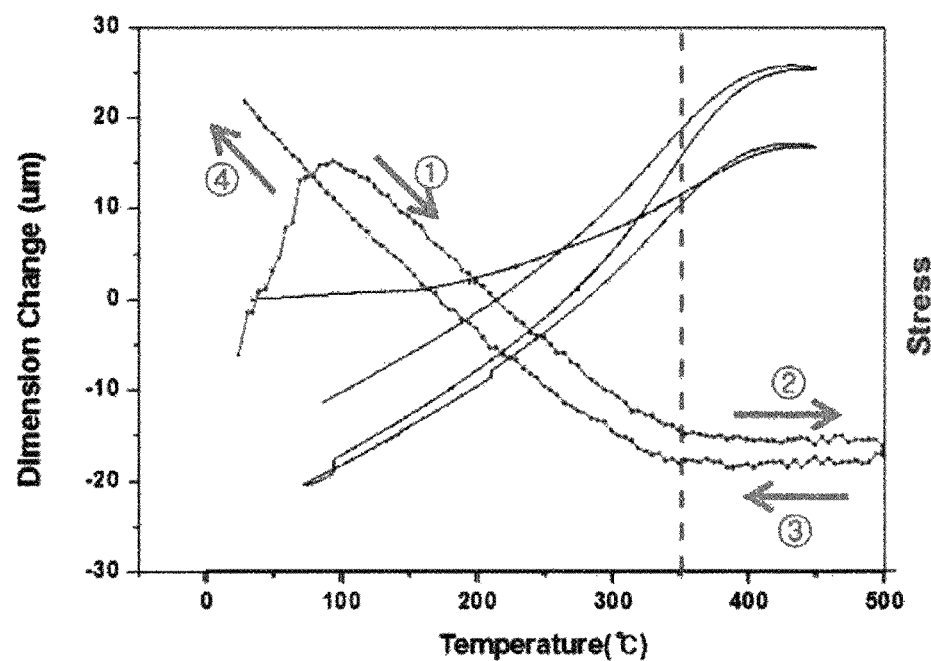
[Fig. 1b]
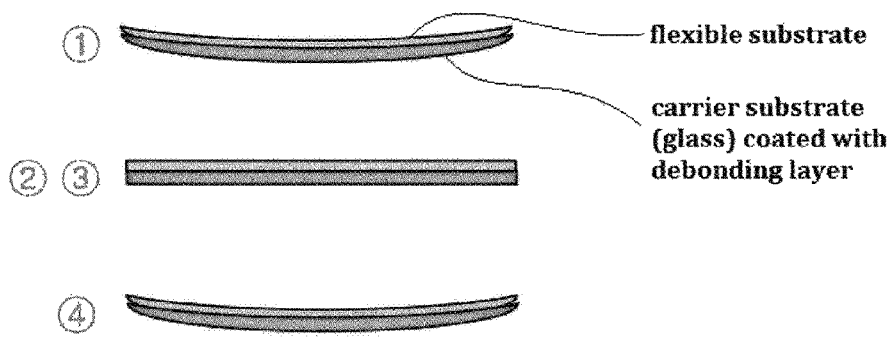

[Fig. 2a]
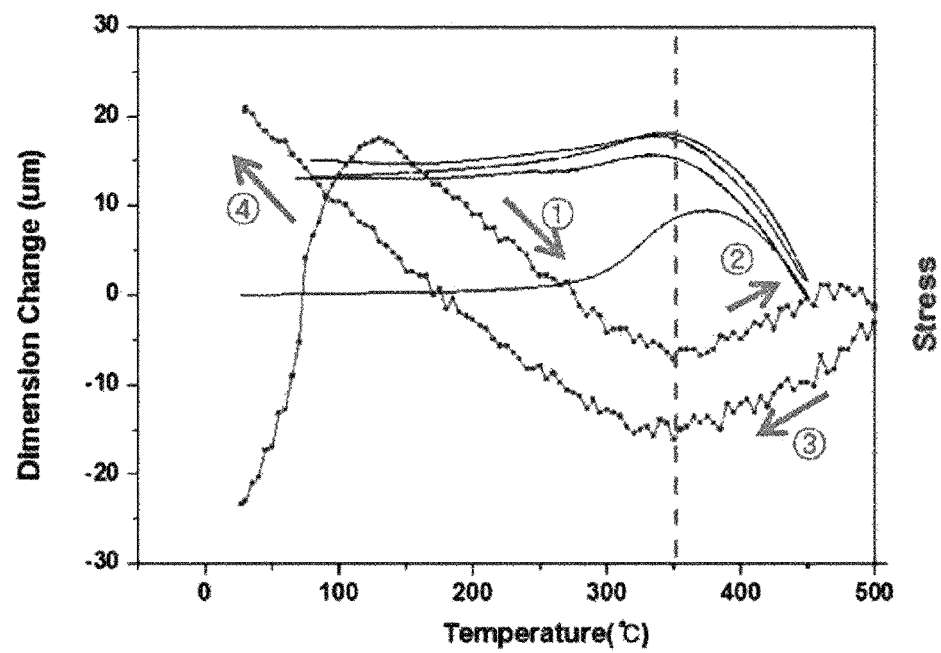
[Fig. 2b]
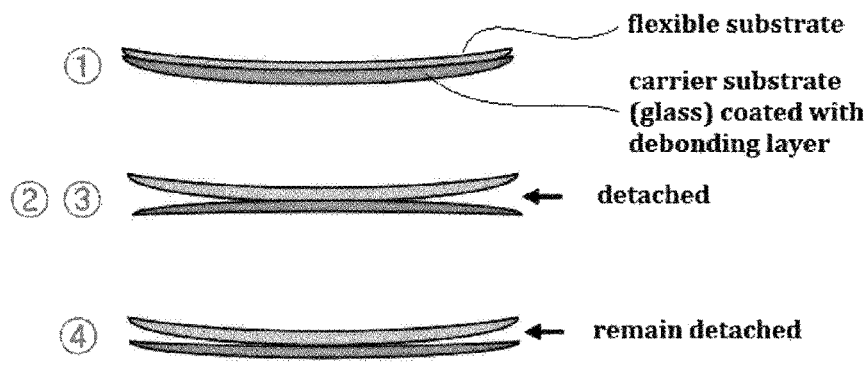

[Fig. 3a]
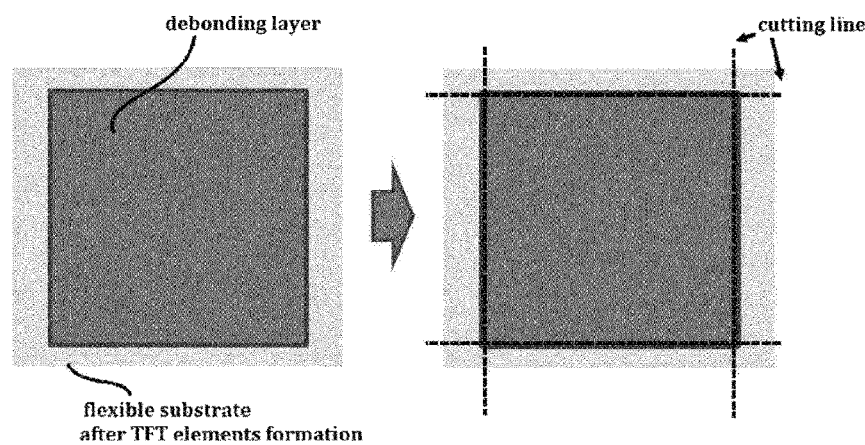
[Fig. 3b]
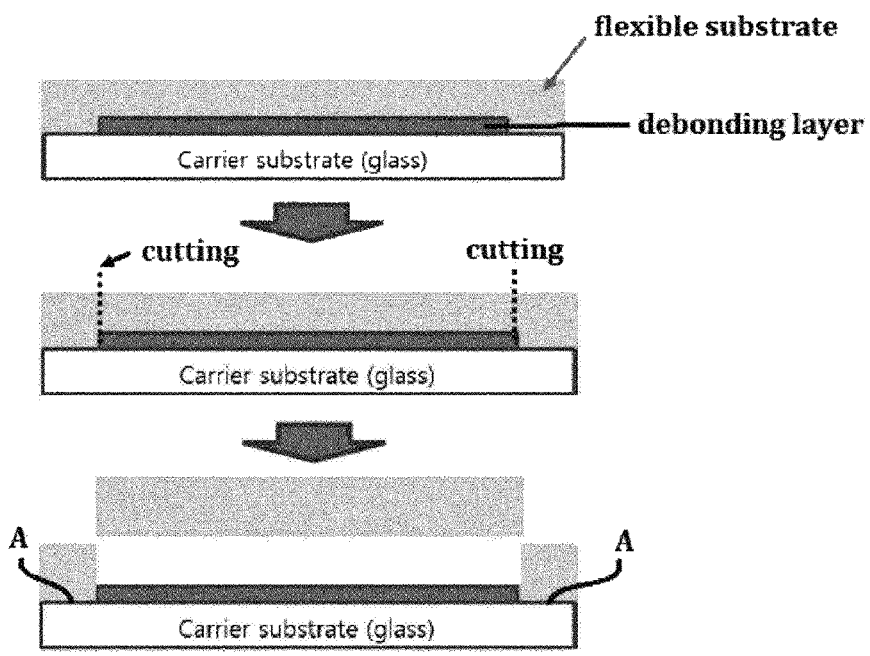

LAMINATE FOR MANUFACTURING FLEXIBLE DISPLAY, AND FLEXIBLE DISPLAY MANUFACTURING METHOD USING SAME

This application is a 35 U.S.C. 371 National Phase Entry Application from PCT/KR2019/011859 filed on Sep. 11, 2019, designating the United States, which claims the benefit of priority to Korean Patent Application No. 10-2018-0108219, filed on Sep. 11, 2018, the entire disclosures of which are incorporated herein by reference.

BACKGROUND OF THE INVENTION

1. Field of the Invention

The present invention relates to a laminate having a debonding layer capable of facilitating separation of a flexible substrate from a carrier substrate and a process for manufacturing a flexible display using the same.

2. Description of the Related Art

The display device market is rapidly changing its focus on flat panel displays (FPDs), which are large in size, thin, and lightweight. Such flat panel displays include a liquid crystal display (LCD), an organic light emitting display (OLED), or an electrophoresis device.

In particular, in recent years, in order to further expand the applications and uses of such flat panel displays, attention has been focused on a so-called flexible display device to which a flexible substrate is applied. The flexible display device is mainly considered to be applied to mobile devices such as smartphones, and it is considered that the field of application is gradually expanded.

However, a process of forming and handling a display device structure such as thin film transistors (TFTs) on plastic (TOP) is an important key process in manufacturing a flexible display device. However, due to the flexibility of the substrate provided in such a flexible display device, there are still many process problems in forming a device structure by directly replacing a flexible plastic substrate to a glass substrate in the existing manufacturing process of the device.

In particular, since a thin film glass included in the flexible substrate is easily broken by impact, the manufacturing process of the display substrate is performed with the thin glass on a carrier glass. Conventionally, after forming a sacrificial layer made of a-silicon or the like on a carrier substrate such as a glass substrate, a flexible substrate was formed thereon. Thereafter, device structures such as thin film transistors were formed on the flexible substrate supported by the carrier substrate by the existing manufacturing process of the device on glass substrates. Then, the sacrificial layer was destroyed by irradiating a carrier substrate or the like with laser or light to separate the flexible substrate on which the device structure is formed, and finally, a device having a flexible substrate such as a flexible display device was manufactured.

However, in the manufacturing process of the prior art, the device structure may be affected during irradiation of laser or light, so that defects may occur, and furthermore an equipment for laser or light irradiation and an additional process are required. As a result, the overall manufacturing process of the device is complicated and the manufacturing cost is also greatly increased.

In addition, since the adhesion between the sacrificial layer of a-Si and the flexible substrate is not sufficient, it is often necessary to form a separate adhesive layer between the sacrificial layer and the flexible substrate, which may complicate the overall process. In addition, since laser or light irradiation under more severe conditions is required, there is an increased concern that may adversely affect the reliability of the device.

BRIEF DESCRIPTION OF THE INVENTION

An object of the present invention is to provide a laminate for manufacturing a flexible display having a debonding layer that is easily separated from a flexible substrate.

Other object of the present invention is to provide a process for manufacturing a flexible display using the laminate.

In order to solve the problem of the present invention provides a laminate comprising:

a carrier substrate;

a debonding layer coated on the carrier substrate and comprising a polyimide having a negative value of CTE at a temperature of 350° C. or higher; and a flexible substrate layer formed on the debonding layer.

According to one embodiment, the debonding layer may have a first area, and the flexible substrate layer may have a second area larger than the first area and completely cover the debonding layer.

According to one embodiment, the polyimide included in the debonding layer may comprise a polymerization and curing product of a dianhydride comprising biphenyl tetracarboxylic dianhydride (BPDA) and a diamine comprising phenylenediamine (PDA).

In addition, the dianhydride may further comprise pyromellitic dianhydride (PMDA), and the diamine may further comprise 2,2'-bis(trifluoromethyl)benzidine (TFMB).

According to one embodiment, the combination of dianhydride and diamine may be selected from BPDA-PDA, BPDA-PMDA-PDA and BPDA-PDA-TFMB.

According to one embodiment, the polyimide included in the debonding layer may be prepared by polymerizing and curing the diamine and dianhydride under the condition in which the diamine is in excess of the equivalent ratio relative to the dianhydride.

According to one embodiment, the combination of dianhydride and diamine is BPDA-PDA-TFMB and the amount of TFMB may be 5 mol % or more of the total diamine.

According to one embodiment, the combination of dianhydride and diamine is BPDA-PMDA-PDA and the amount of PMDA may be 5 mol % or more of the total dianhydride.

According to one embodiment, the polyimide included in the debonding layer may have a thermal decomposition temperature of be 560° C. or more.

According to one embodiment, the debonding layer may have a thickness of 50 nm or more and 1 μm or less.

According to one embodiment, the flexible substrate layer may include a polyimide having a positive value of CTE at a temperature of 350° C. or higher.

In order to solve the other problem of the present invention, the present invention provides a process for manufacturing a flexible display, comprising the steps of:

forming a debonding layer comprising a polyimide having a negative value of CTE at 350° C. or higher on a carrier substrate;

forming a flexible substrate layer on the debonding layer;

forming a device on the flexible substrate layer; and peeling the flexible substrate layer on which the device is formed from the debonding layer.

According to one embodiment, the debonding layer may be formed on a carrier substrate to have a first area, the flexible substrate layer may be formed to have a second area larger than the first area and completely cover the debonding layer, and the device may be formed on the flexible substrate layer in a region where the debonding layer and the flexible substrate overlap.

According to one embodiment, the step of peeling the flexible substrate layer may be performed by cutting in a direction perpendicular to the carrier substrate at an inner edge of the region where the debonding layer and the flexible substrate overlap to separate the flexible substrate layer from the debonding layer.

According to one embodiment, the peeling strength to peel off the flexible substrate layer from the debonding layer during the peeling may be 0.05 N/cm or less.

According to one embodiment, the separating the polyimide substrate layer from the carrier substrate on which the debonding layer is formed may not comprise a process of causing a chemical or physical change between the debonding layer and the flexible substrate layer.

Effect of the Invention

In the laminate for manufacturing a flexible display according to the present invention, a polyimide having a negative value of CTE (coefficient of thermal expansion) at a temperature of 350° C. or higher is used in a debonding layer for separating a flexible substrate from a carrier substrate, thereby facilitating the separation of the flexible substrate from the carrier substrate by using a detachment phenomenon due to the difference in residual stress between the flexible substrate and the debonding layer during the high-temperature forming process. From this, the flexible substrate can be separated without chemical or physical damage to the device formed on the flexible substrate, thereby minimizing the problems that may occur during the peeling process.

BRIEF DESCRIPTION OF THE DRAWINGS

FIGS. 1a and 1b are a graph showing dimension change and residual stress change depending on the temperature change (FIG. 1a) and a schematic diagram showing the warpage change of the laminate (FIG. 1b) when the CTE of the debonding layer has a positive value.

FIGS. 2a and 2b are a graph showing dimension change and residual stress change depending on the temperature change (FIG. 2a), and a schematic diagram showing the warpage change of the laminate (FIG. 2b) when the CTE of the debonding layer has a negative value.

FIGS. 3a and 3b are a plan view (FIG. 3a) and a cross-sectional view (FIG. 3b) for explaining a process of peeling a flexible substrate on which the device is formed from a laminate for manufacturing a flexible display according to an embodiment of the present invention.

DETAILED DESCRIPTION OF THE INVENTION

Since various modifications and variations can be made in the present invention, particular embodiments are illustrated in the drawings and will be described in detail in the detailed description. It should be understood, however, that the invention is not intended to be limited to the particular embodiments, but includes all modifications, equivalents, and alternatives falling within the spirit and scope of the invention. In the following description of the present invention, detailed description of known functions will be omitted if it is determined that it may obscure the gist of the present invention.

In the present disclosure, all compounds or organic groups may be substituted or unsubstituted, unless otherwise specified. Herein, the term "substituted" means that at least one hydrogen contained in the compound or the organic group is substituted with a substituent selected from the group consisting of a halogen atom, an alkyl group or a halogenated alkyl group having 1 to 10 carbon atoms, a cycloalkyl group having 3 to 30 carbon atoms, an aryl group having 6 to 30 carbon atoms, a hydroxyl group, an alkoxy group having 1 to 10 carbon atoms, a carboxylic group, an aldehyde group, an epoxy group, a cyano group, a nitro group, an amino group, a sulfonic group or a derivative thereof.

Flexible displays are demanding in the market because of their free form, light, thin and unbreakable characteristics. In the implementation of such a flexible display, a polyimide comprising BPDA-PDA having excellent heat resistance is mainly used as a flexible substrate.

The process of forming such a flexible display mainly comprises forming a flexible substrate made of a polymer material such as a polyimide on a glass substrate which is a support substrate, forming a device thereon, and then irradiating with a laser to separate the flexible substrate from the glass substrate.

However, in the case of laser detachment, the equipment investment cost may be increased and there may be damage to TFT devices when the laser is transmitted through the plastic substrate, which may cause a decrease in yield.

In order to solve the problems of prior art, the present invention provides a laminate comprising:
a carrier substrate;
a debonding layer coated on the carrier substrate and comprising a polyimide having a negative value of CTE at a temperature of 350° C. or higher; and
a flexible substrate layer formed on the debonding layer.

In addition, the present invention provides a process for manufacturing a flexible display, comprising the steps of:
forming a debonding layer comprising a polyimide having a negative value of CTE at 350° C. or higher on a carrier substrate;
forming a flexible substrate layer on the debonding layer;
forming a device on the flexible substrate layer; and
peeling the flexible substrate layer on which the device is formed from the debonding layer.

In the case that the polyimide film used as the flexible substrate has a negative value of CTE at high temperature, that is, exhibits shrinkage behavior at a high temperature, problems may occur in a high-temperature heat treatment process.

According to the present invention, by using a polyimide exhibiting such shrinkage behavior at a high temperature in a debonding layer rather than in a flexible substrate, the flexible substrate naturally peel off from the debonding layer by shrinkage through a high temperature process such as a forming process of device. In this way, the flexible substrate can be easily separated from the carrier substrate without any separate processing such as a laser process.

FIG. 1a illustrates a graph showing dimension change and residual stress change depending on the temperature of a polyimide film having a positive value of CTE at 350° C. or higher.

As shown in FIG. 1a, in the case that the polyimide having a positive CTE at 350° C. or higher is used as the debonding layer, stress decreases in the temperature-rising range (①), and stress decreases or is maintained at 350° C. or higher (②③). Afterwards, stress increases again in the temperature-reducing range (④). The stress change pattern is the same as the warpage change pattern according to the temperature change of the general flexible substrate. Therefore, in the case that polyimide having a positive CTE at 350° C. or higher is used as the debonding layer, the warpage change pattern due to the stress change is the same between the flexible substrate and the debonding layer, so that detachment between the flexible substrate and the debonding layer as shown in FIG. 1b does not occur.

FIG. 2a shows a graph showing dimension change and residual stress change depending on the temperature of the polyimide film having a negative value of CTE at 350° C. or higher. As shown in FIGS. 2a and 2b, in the case of the debonding layer of polyimide having a negative value of CTE at 350° C. or higher, stress decreases at a temperature below 350° C. (①), which indicates the same warpage change as that of the flexible substrate. On the other hand, stress increases at a temperature of 350° C. or higher (②) and thus warpage occurs in a direction opposite to the flexible substrate and detachment may occur between the flexible substrate and the debonding layer. Thereafter, in the temperature-reducing range (③), the stress decreases again but the detachment is still retained. This can be seen from the large difference between the stress curve during temperature rise and the stress curve during temperature reduction. Therefore, even if the stress increases below 350° C. (④) and warpage occurs again in the same direction as the flexible substrate, the generated detachment is still remained, whereby the adhesion to the flexible substrate can be lowered. Detachment generated in this way may be larger or maintained in subsequent processes, and the adhesion to the flexible substrate may be lowered, thereby facilitating peeling.

In the present invention, the CTE (coefficient of thermal expansion) is measured by a thermomechanical analyzer, for example, the first temperature-rising step is carried out at a heating rate of 4° C./min from 100 to 460° C., then cooling is carried out at a cooling rate of 5° C./min from 460 to 100° C., and the second temperature-rising step is carried out at a heating rate of 4° C./min from 100 to 460° C. The negative value of CTE in the temperature range of 350° C. or higher means that a slope of a graph indicating a change in length (μm) of the specimen depending on the temperature change has a negative value in the temperature range of 350° C. or higher.

The polyimide used in the debonding layer may comprise a polymerization and curing product of a dianhydride comprising biphenyl tetracarboxylic dianhydride (BPDA) and a diamine comprising phenylenediamine (PDA).

In addition, the dianhydride may further comprise pyromellitic dianhydride (PMDA), and the diamine may further comprise 2,2'-bis(trifluoromethyl)benzidine (TFMB).

According to one embodiment, the combination of acid dianhydride and diamine may be selected from BPDA-PDA, BPDA-PMDA-PDA and BPDA-PDA-TFMB.

Herein the abbreviation means:
BPDA: biphenyl-tetracarboxylic acid dianhydride
PDA: phenylene diamine
PMDA: pyromellitic dianhydride
TFMB: 2,2'-bis(trifluoromethyl)benzidine The polyimide may be obtained by polymerization under the condition in which the diamine is in excess of the equivalent ratio relative to the dianhydride. For example, BPDA-PDA may be polymerized by using a diamine PDA in excess of the equivalent ratio compared to BPDA.

The BPDA-PMDA-PDA may be polymerized by using PDA in excess of the equivalent ratio of sum of BPDA and PMDA, and the BPDA-PDA-TFMB may be polymerized by using PDA in excess of the equivalent ratio of sum of BPDA and TFMB.

The polymerization under the condition in which the diamine is in excess of the equivalent ratio relative to the dianhydride may be, for example, the polymerization of the dianhydride and the diamine in a molar ratio of 0.9:1 to 0.99:1. The molar ratio of dianhydride to 1 mole of diamine may be 0.95~0.99 or 0.97~0.99 or 0.98~0.99 or 0.985~0.99.

In general, polyimide prepared by polymerizing and curing diamine in excess of equivalent ratio of dianhydride is advantageous in terms of viscosity and molecular weight stability, but there is a problem of negative CTE, that is, shrinkage behavior at a high temperature, which may cause defects in the high-temperature heat treatment process. For example, there are problems that various defects can be occurred such as cracking of the inorganic film formed on the flexible substrate and detachment of the film due to the residual stress generated after a high-temperature heat treatment process. According to the present invention, by using a polyimide having a negative value of CTE (coefficient of thermal expansion) at a temperature of 350° C. or higher as a debonding layer for separating a flexible substrate from a carrier substrate, the flexible substrate on which the device is formed in the high temperature process can be separated from the carrier substrate without damage without undergoing a process causing chemical or physical change such as laser irradiation process or a formation and removal processes of a sacrificial layer.

According to one embodiment, in the polymerization of polyimide of BPDA-PMDA-PDA, PMDA may be present in at least 5 mol % or at least 8 mol % or at least 10 mol %, and at most 18 mol % or at most 15 mol % of the total dianhydride content.

In addition, according to another embodiment, in the polymerization of polyimide of BPDA-PDA-TFMB, TFMB may be present in at least 5 mol % or at least 8 mol % or at least 10 mol %, and at most 18 mol % or at most 15 mol % of the total diamine content.

According to one embodiment, the thermal decomposition temperature of the polyimide used as the debonding layer should be higher than the process temperature of the flexible display device, for example, the polyimide should not be decomposed even in a high temperature process up to 500° C., preferably it may have a thermal decomposition temperature of more than 560° C.

According to one embodiment, the curing temperature of the debonding layer may be 350° C. or more, preferably 400° C. or more. Curing at a temperature of 350° C. or more may form a debonding layer having a shrinkage phenomenon different from that of the flexible substrate, thereby facilitating peeling.

The thickness of the debonding layer may be 50 nm or more and 1 μm or less. When the thickness of the debonding layer is less than 50 nm or more than 1 μm, the debonding layer may have difficulty in peeling because of insufficient shrinkage according to temperature change. The thickness of the debonding layer may be 70 nm or more, 80 nm or more, or 90 nm or more, and may be 800 nm or less, 600 nm or less, 400 nm or less, or 200 nm or less.

According to one embodiment, the peel strength for peeling off the flexible substrate layer from the debonding layer during the peeling may be 0.05 N/cm or less or 0.04 N/cm or less or 0.03 N/cm or less.

In the process of coating and curing a polyimide precursor for a flexible substrate to form a flexible substrate layer on the debonding layer, detachment between the debonding layer and the flexible substrate layer may occur. As the heat treatment process for forming the device is repeated, the detachment may become greater, thereby decreasing the adhesion between the flexible substrate layer and the debonding layer. In this case, the heat treatment process may be performed at 350° C. or more, and the adhesive force (or peel strength) between the debonding layer and the flexible substrate layer may be 0.05 N/m or less after the repeated heat treatment processes.

According to one embodiment, the CTE of the polyimide flexible substrate layer formed on the debonding layer has a positive value at a temperature of 350° C. or higher, preferably 7 ppm/° C. or less, more preferably 4 ppm/° C. or less. The flexible substrate layer has a positive value of CTE at a temperature of 350° C. or higher, so that the film change pattern according to the temperature change is different from that of the debonding layer, causing detachment and facilitating peeling off the flexible substrate layer from the debonding layer.

The laminate for manufacturing a flexible display according to one embodiment of the present invention comprises:
a carrier substrate;
a debonding layer formed on the carrier substrate and having a first area; and
a flexible substrate layer having a second area larger than the first area and completely covering the debonding layer.

FIGS. 3a and 3b show a plan view and a cross-sectional view of a laminate according to one embodiment, respectively.

Referring to FIGS. 3a and 3b, a debonding layer is formed on a carrier substrate, and the area of the debonding layer is called a first area. On the debonding layer a flexible substrate layer is formed, wherein the flexible substrate layer is formed with a second area larger than the first area of the debonding layer. That is, since the flexible substrate layer is formed to completely cover the debonding layer, there may exist a region A in which the carrier substrate and the flexible substrate layer directly contact each other.

In this case, since the adhesive force between the carrier substrate and the flexible substrate layer is greater than the adhesive force between the flexible substrate and the debonding layer, the adhesive force may provide process stability even in the forming process of the device.

That is, even if the adhesive force between the flexible substrate layer and the debonding layer is deteriorated due to warpage caused by the CTE change of the debonding layer at a process temperature of 350° C. or higher, the flexible substrate layer and the debonding layer do not separate or move due to the region A where the flexible substrate layer and the carrier substrate are bonded to each other in the forming process of the device, and thus the forming process of the device can be stably performed even at a high process temperature.

The process for manufacturing a flexible display according to the present invention comprises the steps of:
forming a debonding layer which has a first area on a carrier substrate;
forming the flexible substrate layer which has a second area larger than the first area and completely covers the debonding layer,
forming a device on the flexible substrate layer; and
peeling the flexible substrate layer on which the device is formed from the debonding layer.

The peeling the flexible substrate layer is performed by cutting in a direction perpendicular to the carrier substrate at an inner edge of the region where the debonding layer and the flexible substrate overlap to separate the flexible substrate layer from the debonding layer.

It is preferable that the device to be formed on the flexible substrate layer is formed on the flexible substrate layer in a region where the debonding layer and the flexible substrate overlap, in terms of process efficiency.

The polyimide used as the flexible substrate layer may be, for example, prepared by polymerizing and curing at least one tetracarboxylic dianhydride having a structure of the following formula 1 and at least one diamine having a structure of the following formula 2.

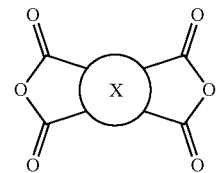

[Formula 1]

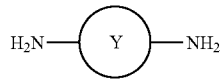

[Formula 2]

In the formula 1, X may be a tetravalent organic group comprising an aliphatic ring having 3 to 24 carbon atoms or an aromatic ring having 6 to 30 carbon atoms, and specifically, X may be a tetravalent organic group comprising an aromatic ring or an aliphatic ring in which each ring structure is a rigid structure, that is, a single ring structure, each ring is connected by a single bond, or each ring is directly connected to each other to form a heterocyclic structure, for example, but may be a tetravalent organic group of the following formulas 3a to 3k, but is not limited thereto.

(3a)

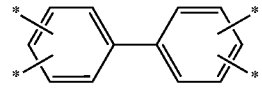

(3b)

(3c)

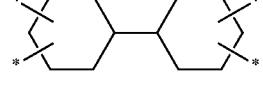

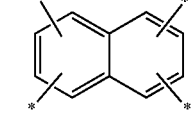

(3d)

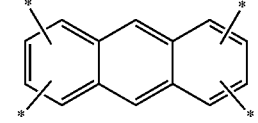

(3e)

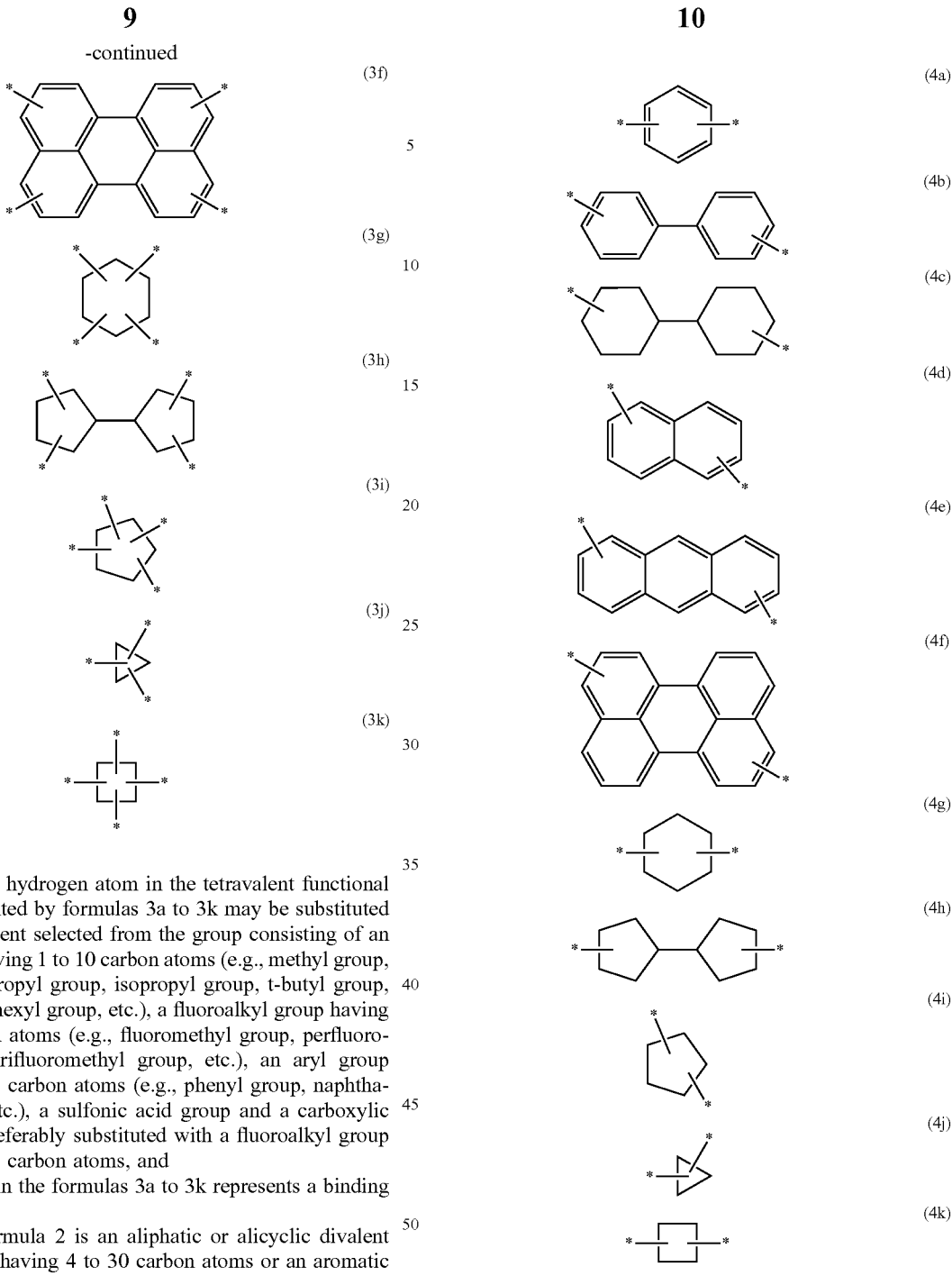

At least one hydrogen atom in the tetravalent functional group represented by formulas 3a to 3k may be substituted with a substituent selected from the group consisting of an alkyl group having 1 to 10 carbon atoms (e.g., methyl group, ethyl group, propyl group, isopropyl group, t-butyl group, pentyl group, hexyl group, etc.), a fluoroalkyl group having 1 to 10 carbon atoms (e.g., fluoromethyl group, perfluoroethyl group, trifluoromethyl group, etc.), an aryl group having 6 to 12 carbon atoms (e.g., phenyl group, naphthalenyl group, etc.), a sulfonic acid group and a carboxylic acid group, preferably substituted with a fluoroalkyl group having 1 to 10 carbon atoms, and

* indicated in the formulas 3a to 3k represents a binding site.

Y in the formula 2 is an aliphatic or alicyclic divalent organic group having 4 to 30 carbon atoms or an aromatic divalent organic group having 6 to 30 carbon atoms, or a combination thereof, wherein the aliphatic, alicyclic or aromatic divalent organic group is connected to each other directly or via a crosslinking group. For example, Y may be a monocyclic or polycyclic aromatic group having 6 to 30 carbon atoms, a monocyclic or polycyclic alicyclic group having 6 to 30 carbon atoms, or a structure in which two or more thereof are connected by a single bond, more specifically, Y may be a divalent organic group comprising an aromatic ring or an aliphatic ring in which each ring structure is a rigid chain structure, for example, a single ring structure, each ring is connected by a single bond, or each ring is directly connected to each other to form a heterocyclic structure, for example, a divalent organic group of the following formulas 4a to 4k, but is not limited thereto.

At least one hydrogen atom in the divalent functional group represented by formulas 4a to 4k may be substituted with a substituent selected from the group consisting of an alkyl group having 1 to 10 carbon atoms (e.g., methyl group, ethyl group, propyl group, isopropyl group, t-butyl group, pentyl group, hexyl group, etc.), a fluoroalkyl group having 1 to 10 carbon atoms (e.g., fluoromethyl group, perfluoroethyl group, trifluoromethyl group, etc.), an aryl group having 6 to 12 carbon atoms (e.g., phenyl group, naphthalenyl group, etc.), a sulfonic acid group and a carboxylic acid group, preferably substituted with a fluoroalkyl group having 1 to 10 carbon atoms, and

* indicated in the formulas 4a to 4k represents a binding site.

According to one embodiment, the polyimide for a flexible substrate may be obtained by curing the precursor obtained by polymerizing the acid dianhydride of formula 1 and the diamine of formula 2 in an excess amount of the acid dianhydride relative to the total molar amount of the diamine.

The polymerization reaction of the acid dianhydride and the diamine compound for producing the polyimide for the debonding layer and the flexible substrate can be carried out according to a conventional polymerization method of a polyimide or a precursor thereof, such as solution polymerization.

The reaction may be carried out under anhydrous conditions and the reaction temperature during the polymerization reaction may be −75 to 50° C., preferably 0 to 40° C. The reaction may be carried out by adding the acid dianhydride with the diamine compound dissolved in an organic solvent.

In addition, the organic solvent that can be used in the polymerization reaction may be selected from the group consisting of ketones such as γ-butyrolactone, 1,3-dimethyl-imidazolidinone, methyl ethyl ketone, cyclohexanone, cyclopentanone and 4-hydroxy-4-methyl-2-pentanone; aromatic hydrocarbons such as toluene, xylene and tetramethylbenzene; glycol ethers (Cellosolve) such as ethylene glycol monoethyl ether, ethylene glycol monomethyl ether, ethylene glycol monobutyl ether, diethylene glycol monoethyl ether, diethylene glycol monomethyl ether, diethylene glycol monobutyl ether, propylene glycol monomethyl ether, propylene glycol monoethyl ether, dipropylene glycol diethyl ether and triethylene glycol monoethyl ether; ethyl acetate, butyl acetate, ethylene glycol monoethyl ether acetate, ethylene glycol monobutyl ether acetate, diethylene glycol monoethyl ether acetate, dipropylene glycol monomethyl ether acetate, ethanol, propanol, ethylene glycol, propylene glycol, carbitol, dimethylacetamide (DMAc), N,N-diethylacetamide (DEAc), dimethylformamide (DMF), diethylformamide (DEF), N-methylpyrrolidone (NMP), N-ethylpyrrolidone (NEP), N-vinylpyrrolidone 1,3-dimethyl-2-imidazolidinone, N,N-dimethylmethoxyacetamide, dimethyl sulfoxide, pyridine, dimethyl sulfone, hexamethylphosphoramide, tetramethylurea, N-methylcarrolactam, tetrahydrofuran, m-dioxane, p-dioxane, 1,2-dimethoxyethane, bis(2-methoxyethyl)ether, 1,2-bis(2-methoxyethoxy)ethane, bis [2-(2-methoxyethoxy)]ether, and a mixture thereof.

In addition, in the case of synthesizing polyamic acid or polyimide, in order to inactivate excess polyamino group or acid anhydride group, an end-capping agent may be further added in which the terminal of the molecule reacts with dicarboxylic acid anhydride or monoamine to end-cap the terminal of the polyimide.

The method for producing a polyimide using the prepared polyimide precursor composition includes a curing step of applying the polyimide precursor composition to one surface of a substrate and heat-treating to imidize.

Specifically, the polyimide precursor composition may be in the form of a solution dissolved in an organic solvent. For example, when the polyimide precursor is synthesized in an organic solvent, the polyimide precursor composition may be a polyimide precursor solution as obtained after polymerization or with added by the same solution, or may be obtained by diluting the polyimide obtained after polymerization with another solvent.

The polyimide precursor composition may include solids in an amount such that the polyimide precursor composition has an appropriate viscosity in consideration of processability such as coating property in the film-forming process, and the solid content is 5 to 20% by weight based on the total weight of the polyimide precursor composition. Alternatively, the polyimide precursor composition may be adjusted to have a viscosity of 400 to 50,000 cP. The viscosity can be measured by standard methods of ASTM D4287, ISO2884. The viscosity of the polyimide precursor composition may be less than 400 cP, and when the viscosity of the polyimide precursor composition is greater than 50,000 cP, fluidity may be lowered during manufacturing of the display substrate using the polyimide precursor composition, which may cause problems in the manufacturing process, such as uneven coating.

As the carrier substrate, a glass substrate, a metal substrate, a plastic substrate, or the like can be used without any particular limitation. Among them, a glass substrate may be preferable which is excellent in thermal and chemical stabilities during imidization and curing processes for the polyimide precursor and can be easily separated even without any treatment with additional release agent while not damaging the polyimide film formed after curing.

The applying or coating process may be carried out according to a conventional application method. Specifically, a spin coating method, a bar coating method, a roll coating method, an air knife method, a gravure method, a reverse roll method, a kiss roll method, a doctor blade method, a spray method, a dipping method, a brushing method, or the like may be used. Of these, it is more preferable to carry out by a casting method which allows a continuous process and enables to increase an imidization rate of polyimide resin.

In addition, the polyimide precursor solution may be applied on the substrate in the thickness range such that the polyimide film to be finally produced has a thickness suitable for a debonding layer or a display substrate.

After the application of the polyimide precursor composition, a drying process for removing the solvent remained in the polyimide precursor composition may be further optionally performed prior to the curing process.

The drying process may be carried out according to a conventional method. Specifically, the drying process may be carried out at a temperature of 140° C. or lower, or from 80° C. to 140° C. If the drying temperature is lower than 80° C., the drying process becomes longer. If the drying temperature exceeds 140° C., the imidization proceeds partially, making it difficult to form a polyimide film having a uniform thickness.

Subsequently, the curing process may be performed by heat treatment at a temperature of 80° C. to 450° C. The curing process may be performed in a multi-step heating process within the above-described temperature range. The curing time in the curing process is not particularly limited, for example for 3 to 30 minutes.

After the curing process, a subsequent heat treatment process may be optionally performed to increase the imidization rate of the polyimide resin in the polyimide film to form a polyimide film having the above-described physical properties.

The heat treatment process is preferably carried out for 1 minute to 30 minutes at 200° C. or more, or 200° C. to 450° C. In addition, the subsequent heat treatment process may be performed once or may be performed in multiple stages two or more times. Specifically, it may be performed in three steps including a first heat treatment at 200 to 220° C., a second heat treatment at 300° C. to 380° C., and a third heat treatment at 400° C. to 450° C.

The polyimide included in the flexible substrate layer may have a glass transition temperature of about 360° C. or more.

Since it has such excellent heat resistance, the film containing the polyimide can maintain excellent heat resistance and mechanical property with respect to the high temperature heat added during the manufacturing process of the device.

Hereinafter, embodiments of the present invention will be described in detail so that those skilled in the art can easily carry out the present invention. The present invention may, however, be embodied in many different forms and should not be construed as limited to the embodiments set forth herein.

<Preparation Example 1> Polymerization of Polyimide Precursor of BPDA-pPDA (98.9:100)

After charging 100 g of NMP (N-methyl-2-pyrollidone) into a reactor with nitrogen stream, 6.243 g (57.726 mmol) of para phenylenediamine (p-PDA) was dissolved while maintaining the temperature of the reactor at 25° C. At the same temperature, 16.797 g (57.091 mmol) of 3,3',4,4'-biphenyltetracarboxylic dianhydride (s-BPDA) and 56.96 g of NMP were added to the solution of p-PDA, and stirred for a predetermined time to polymerize a polyamic acid, thereby preparing a polyimide precursor.

The organic solvent was added in such an amount that the solid concentration of the polyimide precursor prepared from the reaction is 12.8 wt % to prepare a polyimide precursor solution.

<Preparation Example 2> Polymerization of Polyimide Precursor of BPDA-PMDA-pPDA (88.9:10:100)

After charging 100 g of NMP (N-methyl-2-pyrollidone) into a reactor with nitrogen stream, 6.364 g (58.849 mmol) of para phenylenediamine (p-PDA) was dissolved while maintaining the temperature of the reactor at 25° C. At the same temperature, 15.393 g (52.316 mmol) of 3,3',4,4'-biphenyltetracarboxylic dianhydride (s-BPDA), 1.289 g (5.885 mmol) of pyromellitic dianhydride (PMDA) and 56.96 g of NMP were added to the solution of p-PDA, and stirred for a predetermined time to polymerize a polyamic acid, thereby preparing a polyimide precursor.

The organic solvent was added in such an amount that the solid concentration of the polyimide precursor prepared from the reaction is 12.8 wt % to prepare a polyimide precursor solution.

<Preparation Example 3> Polymerization of Polyimide Precursor of BPDA-pPDA-TFMB (98.9:90:10)

After charging 100 g of NMP (N-methyl-2-pyrollidone) into a reactor with nitrogen stream, 5.335 g (49.332 mmol) of para phenylenediamine (p-PDA) and 1.775 g (5.481 mmol) of bistrifluoromethyl benzidine (TFMB) were dissolved while maintaining the temperature of the reactor at 25° C. At the same temperature, 15.950 g (54.221 mmol) of 3,3',4,4'-biphenyltetracarboxylic dianhydride (s-BPDA) and 56.96 g of NMP were added to the solution of p-PDA and TFMB, and stirred for a predetermined time to polymerize a polyamic acid, thereby preparing a polyimide precursor.

The organic solvent was added in such an amount that the solid concentration of the polyimide precursor prepared from the reaction is 12.8 wt % to prepare a polyimide precursor solution.

<Preparation Example 4> Polymerization of Polyimide Precursor of BPDA-pPDA (100:98.9)

After charging 100 g of NMP (N-methyl-2-pyrollidone) into a reactor with nitrogen stream, 6.142 g (56.800 mmol) of para phenylenediamine (p-PDA) was dissolved while maintaining the temperature of the reactor at 25° C. At the same temperature, 16.898 g (57.432 mmol) of 3,3',4,4'-biphenyltetracarboxylic dianhydride (s-BPDA) and 56.96 g of NMP were added to the solution of p-PDA, and stirred for a predetermined time to polymerize a polyamic acid, thereby preparing a polyimide precursor.

The organic solvent was added in such an amount that the solid concentration of the polyimide precursor prepared from the reaction is 12.8 wt % to prepare a polyimide precursor solution.

<Preparation Example 5> Polymerization of Polyimide Precursor of BPDA-pPDA/PA (98.9:100:2.2)

After charging 100 g of NMP (N-methyl-2-pyrollidone) into a reactor with nitrogen stream, 6.192 g (57.259 mmol) of para phenylenediamine (p-PDA) was dissolved while maintaining the temperature of the reactor at 25° C. At the same temperature, 16.661 g (56.629 mmol) of 3,3',4,4'-biphenyltetracarboxylic dianhydride (s-BPDA) and 56.96 g of NMP were added to the solution of p-PDA, and stirred for a predetermined time to polymerize a polyamic acid, thereby preparing a polyimide precursor. Thereafter, 0.187 g (1.260 mmol) of phthalic anhydride (PA) was added to the polyamic acid solution, and stirred for a predetermined time to prepare a polyimide precursor.

The organic solvent was added in such an amount that the solid concentration of the polyimide precursor prepared from the reaction is 12.8 wt % to prepare a polyimide precursor solution.

<Preparation Example 6> Polymerization of Polyimide Precursor of BPDA-PMDA-pPDA (90:10:98.9)

A polyimide precursor solution was prepared in the same manner as in Preparation Example 2, except that the molar ratio of BPDA-PMDA-pPDA was changed so that the dianhydride is in excess of the equivalent ratio.

<Preparation Example 7> Polymerization of Polyimide Precursor of BPDA-pPDA-TFMB (100:88.9:10)

A polyimide precursor solution was prepared in the same manner as in Preparation Example 3, except that the molar ratio of BPDA-pPDA-TFMB was changed so that the dianhydride is in excess of the equivalent ratio.

Experimental Example 1

Each of the polyimide precursor solutions prepared in Preparation Examples 1 to 7 was spin coated on a glass substrate. The glass substrate coated with the polyimide precursor solution was placed in an oven, heated at a rate of 6° C./min and cured at 400° C. for 10 minutes. After completion of the curing process, the glass substrate was immersed in water to remove the film formed on the glass substrate and dried in an oven at 100° C. to prepare a polyimide film having a thickness of 6 μm.

The coefficient of thermal expansion (CTE) and thermal decomposition temperature of the prepared polyimide film were measured as follows and the results are shown in Table 1 below.

<Measurement of Coefficient of Thermal Expansion>

The film was cut to 5×20 mm to prepare a sample, and then the sample was loaded into Q400 instrument of TA company by using an accessory. A length of the film to be actually measured was equal to 16 mm. A pulling force was set at 0.02 N. The first temperature-rising step was carried out at a heating rate of 4° C./min from 100 to 460° C., then cooling was carried out at a cooling rate of 5° C./min from 460 to 100° C., and the second temperature-rising step was carried out at a heating rate of 4° C./min from 100 to 460° C. The change in the thermal expansion of the sample was measured with TMA. The dimension change of the sample depending on the temperature change by the heating is shown in FIG. 1a, the thermal expansion coefficient measured in the temperature range is shown in Table 1 below.

<Measurement of Thermal Decomposition Temperature>

The temperature at which the weight loss of the polymer was 1% was measured using a Discovery TGA manufactured by TA instruments in a nitrogen atmosphere.

TABLE 1

|  | Unit | Prep. Ex. 1 | Prep. Ex. 2 | Prep. Ex. 3 | Prep. Ex. 4 | Prep. Ex. 5 | Prep. Ex. 6 | Prep. Ex. 7 |
|---|---|---|---|---|---|---|---|---|
| Film thickness | μm | 6 | 6 | 6 | 6 | 6 | 6 | 6 |
| Thermal property | CTE ppm/°C. | −1.4 | −3.7 | −4.3 | 7.3 | 4.8 | 2.5 | 5.9 |
|  | Td_1% °C. | 570 | 567 | 564 | 560 | 569 | 562 | 552 |

From the results of Table 1, it can be seen that the polyimide films of Preparation Examples 1 to 3 in which the diamine is in excess relative to the dianhydride have a negative value of CTE, while the films of Preparation Examples 4 to 7 have a positive value of CTE. In Preparation Examples 4, 6 and 7, the dianhydride is in excess relative to the diamine. In Preparation Example 5, the diamine (pPDA) is in excess relative to the dianhydride (BPDA), but the end capping agent (PA) is added and thus the content of acid component is much higher than that of diamine.

Example 1

The polyimide precursor solution prepared in Preparation Example 1 was diluted with a solvent to a solid content concentration of 3 wt %, and then spin coated on a part of the glass substrate. The glass substrate coated with the polyimide precursor solution was placed in an oven and heated (200° C., 350° C. and 400° C.) from room temperature at a rate of 6° C./min and maintained for 10 minutes at the final curing temperature to form a debonding layer having a final thickness of 0.1 μm.

In order to form a flexible substrate layer, the polyimide precursor solution of Preparation Example 4 was spin coated to completely cover the debonding layer formed on the glass substrate. The glass substrate coated with the polyimide precursor solution was placed in an oven and heated at a rate of 6° C./min, and maintained for 10 minutes at 120° C. and for 55 minutes at 400° C. to form a flexible substrate layer having a thickness of 10 μm, thereby obtaining a laminate.

Examples 2 and 3

A laminate was prepared in the same manner as in Example 1, except that the debonding layer was formed of the polyimide precursor solutions prepared in Preparation Examples 2 and 3, respectively.

Comparative Examples 1 to 4

A laminate was prepared in the same manner as in Example 1, except that the debonding layer was formed of the polyimide precursor solutions prepared in Preparation Examples 4 to 7, respectively.

<Peel Force Test>

For the laminates prepared in Examples and Comparative Examples, the flexible substrate layer which is completely covering the debonding layer was cut to a rectangular shape having a width of 10 mm and a length of 100 mm and then the peel force was measured by peeling the sample at 50 mm/min with holding the end of the flexible substrate, using Texture Analyzer (TA, XT plus, Stable microsystems). The results are shown in Table 2.

TABLE 2

| Laminate | Debonding layer | Flexible substrate layer | Peel force (N/cm) of debonding layer of final curing temperature of 200° C. | Peel force (N/cm) of debonding layer of final curing temperature of 350° C. | Peel force (N/cm) of debonding layer of final curing temperature of 400° C. |
|---|---|---|---|---|---|
| Example 1 | Preparation Example 1 | Preparation Example 4 | 0.240 | 0.031 | 0.024 |
| Example 2 | Preparation Example 2 | Preparation Example 4 | 0.220 | 0.029 | 0.022 |
| Example 3 | Preparation Example 3 | Preparation Example 4 | 0.200 | 0.027 | 0.021 |
| Comparative Example 1 | Preparation Example 4 | Preparation Example 4 | 0.380 | 0.246 | 0.109 |
| Comparative Example 2 | Preparation Example 5 | Preparation Example 4 | 0.309 | 0.159 | 0.089 |
| Comparative Example 3 | Preparation Example 6 | Preparation Example 4 | 0.250 | 0.135 | 0.077 |
| Comparative Example 4 | Preparation Example 7 | Preparation Example 4 | 0.365 | 0.223 | 0.121 |

From the above results, the laminate according to the example having a debonding layer formed of a polyimide precursor prepared by using diamine in excess of an equivalent ratio relative to dianhydride exhibits a low peel force of 0.05 N/cm or less, unlike the laminate of comparative example, in the case of the final curing temperature to 350°

C. or higher. In addition, in the laminate of Comparative Example 1, the debonding layer and the flexible substrate layer, both of which were made of the polyimide precursor composition of Preparation Example 4, retains a significant high adhesive strength even when the final curing temperature is 350° C. or higher. From this, it can be seen that when the coating area of the flexible substrate layer is larger than the debonding layer to completely cover the debonding layer, the flexible substrate layer is in direct contact with the supporting substrate (glass substrate), so that a stable process is possible without detachment of the flexible substrate layer even in a high heat treatment process.

While the present invention has been particularly shown and described with reference to specific embodiments thereof, it will be apparent to those skilled in the art that this specific description is merely a preferred embodiment and that the scope of the invention is not limited thereby. It is therefore intended that the scope of the invention be defined by the claims appended hereto and their equivalents.

What is claimed is:

1. A laminate comprising:
    a carrier substrate;
    a debonding layer formed on the carrier substrate and comprising a polyimide having a negative value of coefficient of thermal expansion (CTE) at a temperature of 350° C. or higher; and
    a flexible substrate layer formed on the debonding layer,
    wherein the debonding layer has a first surface opposite side of the carrier substrate and having a first size, and the flexible substrate layer has a second surface contacting the debonding layer and having a second size, wherein the second size is larger than the first size such that the second surface of the flexible substrate layer completely covers the first surface of the debonding layer, and
    wherein the polyimide in the debonding layer comprises a polymerization and curing product of a diamine and a dianhydride, wherein the diamine is in excess of the equivalent ratio relative to the dianhydride.

2. The laminate according to claim 1, wherein the dianhydride comprises biphenyl tetracarboxylic dianhydride (BPDA) and the diamine comprises phenylenediamine (PDA).

3. The laminate according to claim 2, wherein the dianhydride further comprises pyromellitic dianhydride (PMDA), and the diamine further comprises 2,2'-bis(trifluoromethyl)benzidine (TFMB).

4. The laminate according to claim 3, wherein a combination of the dianhydride and the diamine is BPDA-PDA, BPDA-PMDA-PDA or BPDA-PDA-TFMB.

5. The laminate according to claim 4, wherein the combination of the dianhydride and the diamine is BPDA-PDA-TFMB and the amount of TFMB is at least 5 mol % of the total diamine.

6. The laminate according to claim 4, wherein the combination of the dianhydride and the diamine is BPDA-PMDA-PDA and the amount of PMDA is at least 5 mol % of the total dianhydride.

7. The laminate according to claim 1, wherein the debonding layer has a thickness of 50 nm or more and 1 µm or less.

8. The laminate according to claim 1, wherein the flexible substrate layer includes a polyimide having a positive value of CTE at a temperature of at least 350° C.

9. A process for manufacturing a flexible display, comprising the steps of:
    forming a device on the flexible substrate layer included in the laminate according to claim 1; and
    peeling the flexible substrate layer on which the device is formed from the debonding layer; wherein
    the debonding layer has a first surface opposite side of the carrier substrate and having a first size,
    the flexible substrate layer is formed to have a second surface contacting the debonding layer and having a second size,
    wherein the second size is larger than the first size such that the second surface of the flexible substrate layer completely covers the first surface of the debonding layer, and
    the device is formed on a surface of the flexible substrate layer that is an opposite side of the debonding layer in a region where the debonding layer and the flexible substrate layer overlap.

10. The process for manufacturing a flexible display according to claim 9, wherein the step of peeling the flexible substrate layer comprises cutting in a direction perpendicular to the carrier substrate at each of inner edges of the region where the debonding layer and the flexible substrate layer overlap and separating the flexible substrate layer from the debonding layer such that the debonding layer and cross sections of the flexible substrate layer are exposed.

11. The process for manufacturing a flexible display according to claim 9, wherein a peeling strength for peeling off the flexible substrate layer from the debonding layer during the peeling is 0.05 N/cm or less.

12. The process for manufacturing a flexible display according to claim 9, wherein the peeling the flexible substrate layer on which the device is formed from the debonding layer included in the laminate does not comprises a process of causing a chemical or physical change in a surface between the debonding layer and the flexible substrate layer.

* * * * *